US012604695B2

(12) United States Patent
Kawai et al.

(10) Patent No.: US 12,604,695 B2
(45) Date of Patent: *Apr. 14, 2026

(54) EFEM

(71) Applicant: Sinfonia Technology Co., Ltd., Tokyo (JP)

(72) Inventors: Toshihiro Kawai, Tokyo (JP); Gengoro Ogura, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 623 days.

This patent is subject to a terminal disclaimer.

(21) Appl. No.: 17/902,148

(22) Filed: Sep. 2, 2022

(65) Prior Publication Data

US 2023/0073234 A1 Mar. 9, 2023

(30) Foreign Application Priority Data

Sep. 8, 2021 (JP) ................................. 2021-146406

(51) Int. Cl.
| | |
|---|---|
| *H01L 21/67* | (2006.01) |
| *H01L 21/673* | (2006.01) |
| *H01L 21/677* | (2006.01) |
| *H01L 21/687* | (2006.01) |

(52) U.S. Cl.
CPC .. *H01L 21/67017* (2013.01); *H01L 21/67393* (2013.01); *H01L 21/67766* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 12,201,995 B2 * | 1/2025 | Kawai ............... | H01L 21/67775 |
| 2015/0170945 A1 | 6/2015 | Segawa et al. | |
| 2018/0204753 A1 * | 7/2018 | Kawai ............... | H01L 21/67772 |
| 2018/0254209 A1 * | 9/2018 | Kawai ................... | F16K 15/028 |
| 2019/0326134 A1 * | 10/2019 | Suzuki ............. | H01L 21/67775 |

(Continued)

FOREIGN PATENT DOCUMENTS

| | | |
|---|---|---|
| JP | 2015146349 A | 8/2015 |
| JP | 2017005283 A | 1/2017 |

(Continued)

*Primary Examiner* — Sylvia MacArthur

(74) *Attorney, Agent, or Firm* — Kilpatrick Townsend & Stockton LLP

(57) ABSTRACT

An EFEM is provided with a circulation path including a substrate transfer space formed inside a housing and a return path configured to return gas flowing from one side to the other side of the substrate transfer space, the EFEM including: a partition wall configured to separate the substrate transfer space and the return path; a capture part provided in the return path having a higher pressure than the substrate transfer space in a state in which the gas circulates through the circulation path, and configured to capture particles contained in the gas flowing through the return path; and a connecting pipe configured to guide the gas flowing inside a predetermined device arranged in the substrate transfer space to the return path, wherein the connecting pipe is connected to the return path on an upstream side of the capture part in a gas flow direction.

8 Claims, 1 Drawing Sheet

(56) References Cited

U.S. PATENT DOCUMENTS

| | | | | |
|---|---|---|---|---|
| 2020/0219281 | A1 | 7/2020 | Ogata et al. | |
| 2021/0013077 | A1 | 1/2021 | Kawai et al. | |
| 2021/0013078 | A1* | 1/2021 | Kawai | H01L 21/67017 |
| 2022/0347694 | A1* | 11/2022 | Kawai | H01L 21/67017 |
| 2023/0073234 | A1* | 3/2023 | Kawai | H01L 21/68 |
| 2024/0038554 | A1* | 2/2024 | Kawai | B01D 53/40 |

FOREIGN PATENT DOCUMENTS

| | | | |
|---|---|---|---|
| JP | 2019016116 | A | 1/2019 |
| JP | 2019161116 | A | 9/2019 |
| JP | 2019161117 | A | 9/2019 |

* cited by examiner

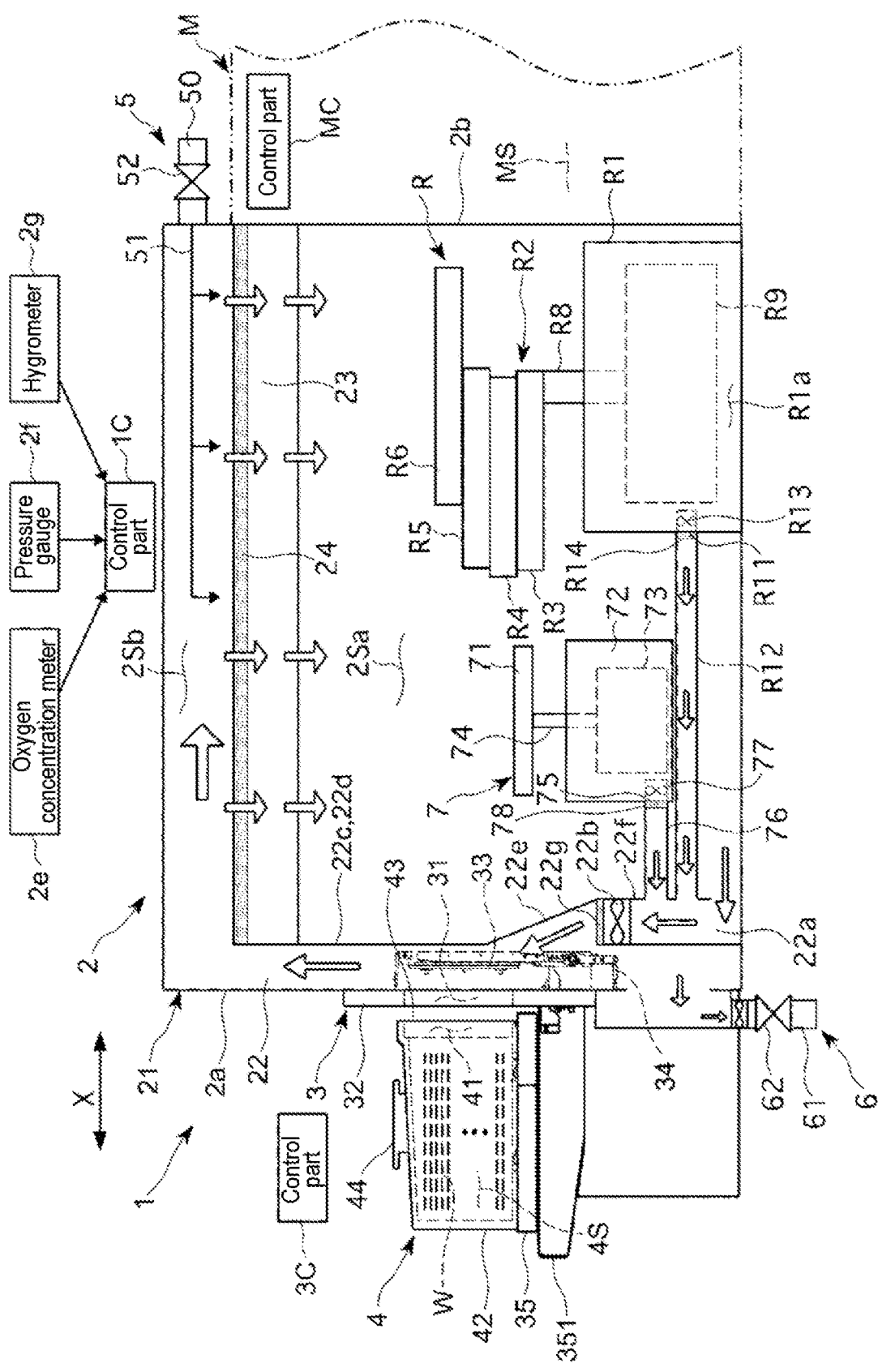

EFEM

CROSS-REFERENCE TO RELATED APPLICATION(S)

This application is based upon and claims the benefit of priority from Japanese Patent Application No. 2021-146406, filed on Sep. 8, 2021, the entire contents of which are incorporated herein by reference.

TECHNICAL FIELD

The present disclosure relates to an EFEM (Equipment Front End Module) used for automatic transfer of a substrate, particularly an EFEM having a function of circulating an inert gas such as a nitrogen gas or the like in a housing which is a main body portion of the EFEM.

BACKGROUND

In a semiconductor manufacturing process, a substrate is processed in a clean room in order to improve the yield and quality. In recent years, there has been adopted a means for transferring and processing a substrate by using a "mini-environment method" that further improves the cleanliness only in a local space around a substrate. In the mini-environment method, a load port is provided adjacent to a housing having a substantially closed substrate transfer space (hereinafter referred to as "transfer space") therein, an FOUP (Front Opening Unified Pod) which is a container having a highly clean internal space storing substrates is mounted on the load port, and a door of the FOUP (hereinafter referred to as "FOUP door") can be opened and closed by the load port in a state of being in close contact with the FOUP.

The EFEM including the housing and the load port is configured so that while opening a door of the load port (load port door) that can be engaged with the FOUP door to open and close the FOUP door, the substrate in the FOUP can be taken out into the housing or the substrate can be stored into the FOUP from the housing by a substrate transfer robot arranged in a substrate transfer space inside the housing.

Further, there is also known an EFEM that prevents or suppresses deterioration of a substrate by replacing the inside of a housing with a nitrogen gas atmosphere. For example, Patent Document 1 discloses an EFEM that includes a circulation flow path for circulating a nitrogen gas inside a housing including a substrate transfer space, a gas supply means for supplying the nitrogen gas to the circulation flow path, and a gas discharge means for discharging the nitrogen gas from the circulation flow path. The EFEM is configured to maintain a nitrogen gas atmosphere inside the housing by appropriately supplying and discharging the nitrogen gas according to fluctuations in oxygen concentration, etc. in the circulation flow path.

Devices such as a substrate transfer robot and an aligner are provided in the housing. The particles swirling upward in the devices during the operation of these devices flow into or stay in the substrate transfer space, which may cause deterioration of the substrate.

PRIOR ART DOCUMENT

Patent Document

Patent Document 1: Japanese Patent Application Publication No. 2015-146349

In the case where a return path (return duct) constituting a circulation path and a substrate transfer space are partitioned by a partition wall inside a housing, the pressure in the return path is higher than the pressure in the substrate transfer space with the partition wall as a boundary. Due to such a pressure difference, gas (atmosphere) including the particles in the return path (the particles contained in the gas flowing in the substrate transfer space and the particles contained in the gas flowing inside the devices such as a substrate transfer robot and an aligner and introduced into the return path) are leaked from the return path through the gap in the partition wall. Thus, the particles may enter and contaminate the substrate transfer space.

SUMMARY

In view of such a problem, it is a main object of the present disclosure to provide an EFEM capable of removing, in a return path, particles swirling upward inside a device provided in a substrate transfer space in the return path, effectively reducing the number of particles flowing into the substrate transfer space from the return path where a pressure difference is generated in a housing, and avoiding a situation where the particles in the substrate transfer space adversely affect a substrate.

That is, the present disclosure pertains to an EFEM provided with a circulation path including a substrate transfer space formed inside a housing and a return path configured to return gas flowing from one side to the other side of the substrate transfer space. The EFEM according to the present disclosure includes: a partition wall configured to separate the substrate transfer space and the return path; a capture part provided in the return path having a higher pressure than the substrate transfer space in a state in which the gas circulates through the circulation path, and configured to capture particles contained in the gas flowing through the return path; and a connecting pipe configured to guide the gas flowing inside a predetermined device arranged in the substrate transfer space to the return path, wherein the connecting pipe is connected to the return path on an upstream side of the capture part in a gas flow direction.

According to the EFEM of the present embodiment, the gas is introduced into the return path through the connecting pipe from the predetermined device arranged in the substrate transfer space, whereby the particles contained in the gas (the particles generated in the device) can be captured by the capture part. Even if the gas leaks from the return path having a relatively high pressure toward the substrate transfer space having a relatively low pressure, the number of particles in the substrate transfer space is unlikely to increase. This makes it possible to prevent or suppress the adhesion of particles to the substrate in the substrate transfer space. Moreover, in the present disclosure, the gas flowing inside the device is introduced into the return path at a position of the upstream side of the capture part in the gas flow direction, whereby the particles contained in the mixed gas including the gas flowing through the substrate transfer space and the gas flowing inside the device can be efficiently captured by the capture part.

In the EFEM according to the present disclosure, the predetermined device arranged in the substrate transfer space and connected to the return path by the connecting pipe may be a substrate transfer robot or an aligner. Since the substrate transfer robot or the aligner has built-in drive mechanism parts that slide or reciprocate, particles may be generated or swirl up from the location where these parts are placed. According to the present disclosure, the gas containing the particles generated inside the device is sucked into the return path through the connecting pipe, whereby the particles can be captured by the capture part.

Particularly, the fan that sucks the gas in the substrate transfer space sends the gas into the return path is provided at or near the upstream end of the return path, whereby the gas can be efficiently sent toward the inside of the return path. Further, if the capture part is provided on the downstream side of the fan in the gas flow direction, it is possible for the capture part to more efficiently capture the particles generated inside the predetermined device in the substrate transfer space.

BRIEF DESCRIPTION OF DRAWINGS

The accompanying drawings, which are incorporated in and constitute a part of the specification, illustrate embodiments of the present disclosure.

FIG. 1 is a side view schematically showing a relative positional relationship between an EFEM according to an embodiment of the present disclosure and a peripheral device thereof.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an embodiment of the present disclosure will be described with reference to the drawings.

As shown in FIG. 1, the EFEM (Equipment Front End Module) 1 according to the present embodiment includes a housing 2 as a main body part and a load port 3 arranged in a clean room in a semiconductor manufacturing process. FIG. 1 schematically shows the relative positional relationship between the EFEM 1 and a peripheral device thereof. An FOUP 4 shown in FIG. 1 is a kind of substrate storage container and is used together with the EFEM 1.

A processing apparatus M (semiconductor processing apparatus) is provided adjacent to the back wall 2b of the housing 2 opposite to the front wall 2a on which the load port 3 is arranged. That is, the load port 3 is connected to an opening (front side opening shown in FIG. 1) provided in the front wall 2a of the housing 2, and the processing apparatus M is connected to an opening provided in the back wall 2b. Therefore, substantially closed spaces (a substrate transfer space 2Sa and an FFU installation space 2Sb) are formed inside the housing 2.

In a clean room, the internal space MS of the processing apparatus M, the substrate transfer space 2Sa and the FFU installation space 2Sb, which are the internal spaces of the housing 2, and the internal space 4S of the FOUP 4 mounted on the load port 3 are maintained at high cleanliness.

In the present embodiment, as shown in FIG. 1, the load port 3, the housing 2 and the processing apparatus M are arranged in close contact with each other in this order in the front-rear direction X of the EFEM 1. The operation of the EFEM 1 is controlled by a controller of the entire EFEM 1

(control part 1C shown in FIG. 1) or a controller of the load port 3 (control part 3C shown in FIG. 1), and the operation of the processing apparatus M is controlled by a controller of the processing apparatus M (control part MC shown in FIG. 1). In this regard, the control part MC which is a controller of the entire processing apparatus M and the control part 1C which is a controller of the entire EFEM 1 are higher-level controllers of the control part 3C of the load port 3. Each of these control parts 1C, 3C and MC is composed of a typical microprocessor equipped with a CPU, a memory, an interface, and the like. The memory pre-stores programs necessary for processing, and the CPU sequentially takes out and execute the programs and realizes a desired function in cooperation with peripheral hardware resources.

As shown in FIG. 1, the FOUP 4 mounted on the load port 3 includes a FOUP main body 42 capable of opening the internal space 4S only rearward via a loading/unloading port 41, and a FOUP door 43 capable of opening and closing the loading/unloading port 41. The FOUP 4 may be a known one which is provided with multi-stage slots therein, configured to accommodate substrates W as transfer target objects in the respective slots, and configured to load and unload the substrates W via the loading/unloading port 41. On the upward surface of the FOUP main body 42, there is provided a flange portion 44 to be gripped by a device (e.g., OHT: Over Head Transport) or the like for automatically transferring the FOUP 4. The FOUP 4 is mounted on a mounting table 35 of the load port 3.

As shown in FIG. 1, the load port 3 according to the present embodiment includes a plate-shaped frame 32 constituting a part of the front wall 2a of the housing 2 and having an opening 31 for opening the internal space (substrate transfer space 2Sa) of the housing 2, a load port door 33 configured to open and close the opening 31 of the frame 32, a door opening/closing mechanism 34 configured to open the opening 31 of the frame 32 by moving the load port door 33 to a door opening position retracted toward the housing 2, and a mounting table 35 provided on the frame 32 in a substantially horizontal posture.

The frame 32 is arranged in an upright posture and is formed in a substantially rectangular plate shape with an opening 31 having such a size that allows communication with the loading/unloading port 41 of the FOUP 4 mounted on the mounting table 35. FIG. 1 schematically shows the opening 31 of the frame 32.

The mounting table 35 is provided on the upper portion of the horizontal base 351 (support base) arranged in a substantially horizontal posture at a position slightly above the center in the height direction of the frame 32 and is capable of mounting the FOUP 4 in such an orientation that the FOUP door 43 capable of opening and closing the internal space 4S of the FOUP main body 42 faces the load port door 33. Further, the mounting table 35 is configured to move toward and away from the frame 32 between a predetermined docking position in which the opening of the FOUP main body 42 and the opening 31 of the frame 32 are brought into close contact with each other to integrally opening and close the load port door 33 and the FOUP door 43 and a position in which the FOUP door 43 is spaced apart by a predetermined distance from the frame 32 rather than the docking position (see FIG. 1). In the present embodiment, the FOUP 4 side is defined as the front side and the frame 32 side is defined as the rear side in the front-rear direction X (see FIG. 1 and the like) in which the FOUP 4 mounted on the mounting table 35 and the frame 32 are arranged side by side.

The load port door 33 is configured to move together with the FOUP door 43 by the door opening/closing mechanism 34 among a fully closed position at which the load port door 33 seals the opening 31 of the frame 32 while maintaining the engagement with the FOUP door 43, a door opening position retracted toward the housing 2 side from the fully closed position, and a fully open position at which the load port door 33 fully opens the opening space of the opening 31 rearward. As shown in FIG. 1, the load port door 33 and the door opening/closing mechanism 34 are arranged at positions overlapping with the below-described return path 22 of the circulation path 21 in a side view. However, in reality, the circulation paths 21 are provided at a predetermined pitch in the width direction of the housing 2, and the load port door 33 is moved together with the FOUP door 43 by the door opening/closing mechanism 34 in the space formed between the circulation paths 21 arranged side by side in the width direction and communicating with the substrate transfer space 2Sa. Therefore, the load port door 33 does not move together with the FOUP door 43 on the return path 22.

The load port 3 may be or may not be equipped with a bottom purge device capable of injecting a purging gas composed of an inert gas such as a nitrogen gas or the like into the internal space 4S of the FOUP 4 and replacing the gas atmosphere of the internal space 4S of the FOUP 4 with the purging gas.

A plurality of such load ports 3 (e.g., three in the present embodiment) are arranged on the front wall 2a of the housing 2 at predetermined intervals.

In the EFEM 1 of the present embodiment, a substrate transfer robot R capable of transferring a substrate W (semiconductor wafer) between the FOUP 4 and the processing apparatus M is provided in the substrate transfer space 2Sa of the housing 2 (see FIG. 1).

An FFU 23 (fan filter unit) is provided in the FFU installation space 2Sb, which is a space above the substrate transfer space 2Sa in the internal space of the housing 2. By driving the FFU 23, it is possible to generate a downflow in the substrate transfer space 2Sa of the housing 2 and circulate an inert gas (environmental gas) such as a nitrogen gas or the like, which is a highly clean gas, in the substrate transfer space 2Sa. A circulation path 21 for circulating the nitrogen gas is formed inside the housing 2. The circulation path 21 is composed of the substrate transfer space 2Sa, the FFU installation space 2Sb and the return path 22. In the circulation path 21, a clean nitrogen gas is sent downward from the FFU installation space 2Sb through the FFU 23. The clean nitrogen gas reaches the lower end of the substrate transfer space 2Sa, then rises through the return path 22 and returns to the FFU installation space 2Sb.

The FFU 23 uses a fan to send a nitrogen gas in the FFU installation space 2Sb downward and uses a filter to remove particles contained in the nitrogen gas. When the FFU 23 is driven, the cleaned nitrogen gas passing through the filter is sent from the FFU installation space 2Sb to the substrate transfer space 2Sa to form a laminar flow (downflow) flowing downward. In the present embodiment, a chemical filter 24 for removing an active gas, a molecular contaminant, or the like is arranged on the upstream side or the downstream side (upstream side in the illustrated example) of the FFU 23 in the FFU installation space 2Sb. Therefore, according to the circulation path 21 of the present embodiment, when the nitrogen gas flowing into the FFU installation space 2Sb passes through the chemical filter 24 and the FFU 23, the active gas, the molecular contaminant, or the like flowing into the FFU installation space 2Sb together with the nitrogen gas can be captured and removed in two stages by the chemical filter 24 and the filter of FFU 23, and a downflow with extremely high cleanliness can be formed.

The nitrogen gas that has reached the lower end of the substrate transfer space 2Sa flows into the return path 22 through the opening 22a formed at the lower end of the return path 22. The return path 22 is a path isolated from the substrate transfer space 2Sa and the FFU installation space 2Sb by the partition wall 22c. Only the opening 22a formed at the lower end of the return path 22 communicates with the substrate transfer space 2Sa, and only the upper end of the return path 22 communicates with the FFU installation space 2Sb. In the present embodiment, the partition wall 22c is formed by a hollow cylindrical column 22d that supports the front wall 2a of the housing 2 from the side of the substrate transfer space 2Sa. In the EFEM 1 of the present embodiment, a downward opening 22e communicating with the substrate transfer space 2Sa and having a shape in which the cross-sectional area of the opening gradually increases toward the opening end is formed in the vicinity of the lower end of the column 22d. A duct 22f is attached to the downward opening 22e. The opening end (lower end) of the duct 22f is set to the opening 22a of the return path 22 communicating with the substrate transfer space 2Sa. The opening 22e extends downward along the column 22d constituting the return path 22 and communicates with the opening 22a opened downward. As a result, the return path 22 communicates with the substrate transfer space 2Sa through the opening 22a.

In the present embodiment, such columns 22d are arranged at a predetermined pitch in the width direction of the housing 2. Specifically, the columns 22d are arranged at predetermined positions of the front wall 2a of the housing 2 that do not overlap with the front opening to which the load port 3 is connected, i.e., at a total of four locations including an intersection (corner) between the front wall 2a and the side wall of the housing 2 and both sides of the front opening to which the load port 3 located at the center of the width direction is connected among the three load ports 3. The internal space of each column 22d functions as the return path 22.

In the present embodiment, a fan 22b is provided in the vicinity of the opening 22a of the column 22d. The fan 22b sucks a nitrogen gas into the return path 22 and sends the nitrogen gas upward to return the nitrogen gas to the FFU installation space 2Sb. In particular, in the present embodiment, a filter 22g, which is a capture part, is arranged in the return path 22 on the downstream side of the fan 22b in the gas flow direction. The filter 22g is a physical filter that removes particles such as molecular contaminants or the like. Therefore, the nitrogen gas sucked into the return path 22 by the fan 22b and sent upward is cleaned by the filter 22g.

The EFEM 1 of the present embodiment includes a supply part 5 for supplying a nitrogen gas into the circulation path 21. The supply part 5 includes a nitrogen gas supply source 50 and a supply path 51 whose upstream end is connected to the supply source 50 and whose downstream end is connected to the circulation path 21 to supply a nitrogen gas. In the present embodiment, the supply path 51 is connected to the side portion of the FFU installation space 2Sb. A configuration in which the supply path 51 is connected to a location other than the side portion of the FFU installation space 2Sb may be adopted. A supply valve 52 capable of changing a gas supply amount per unit time is provided at a predetermined position of the supply path 51. The supply valve 52 is configured to change the amount of gas (gas supply amount) flowing through the supply path 51 in response to a command from the control part 1C.

The control part 1C is electrically connected to an oxygen concentration meter 2e, a pressure gauge 2f, a hygrometer 2g, etc. installed in the housing 2 and is configured to receive the measurement results of these measurement instruments to grasp information on the atmosphere inside the housing (In FIG. 1, for the sake of convenience of explanation, the oxygen concentration meter 2e, the pressure gauge 2f and the hygrometer 2g are shown on the outside of the housing 2 together with the control part 1C). Therefore, by allowing the control part 1C to control the opening degree of the supply valve 52 based on the measurement values obtained by the oxygen concentration meter 2e, the hygrometer 2g, etc. provided in the substrate transfer space 2Sa, it is possible to maintain the oxygen concentration and the water concentration in the substrate transfer space 2Sa at a predetermined value or less. Specifically, for example, when the oxygen concentration exceeds a predetermined value, the oxygen concentration can be lowered by controlling the supply valve 52 to increase the flow rate of the nitrogen gas supplied to the circulation path 21.

Further, the EFEM 1 of the present embodiment includes a discharge part 6 for discharging the gas in the circulation path 21. The discharge part 6 includes a discharge pipe 61 whose upstream end is connected to the inside of the circulation path 21 and whose the downstream end communicates with an external space outside the circulation path 21. A discharge valve 62 capable of changing the amount of gas in the circulation path 21 discharged per unit time is provided at a predetermined location of the discharge pipe 61. In the present embodiment, the discharge pipe 61 for discharging the gas in the circulation path 21 is connected to the front end portion of the substrate transfer space 2Sa. The control part 1C controls the opening degree of the discharge valve 62 based on the measurement value obtained by the pressure gauge 2f or the like provided in the substrate transfer space 2Sa, so that the pressure at the position where the pressure gauge 2f is installed can be maintained within a predetermined appropriate range. Specifically, for example, when the pressure value exceeds a predetermined value, the opening degree of the discharge valve 62 is increased, and when the pressure value falls below the predetermined value, the opening degree of the discharge valve 62 is decreased. In a state in which appropriate control is executed by the control part 1C, the pressure in the substrate transfer space 2Sa becomes slightly higher than the pressure in the external space of the housing 2. That is, the appropriate range of the pressure value of the substrate transfer space 2Sa is set to a value slightly higher than the pressure value of the external space of the housing 2, whereby it is possible to prevent the outside air in the external space of the housing 2 from entering the substrate transfer space 2Sa, while preventing or suppressing a situation where the nitrogen gas leaks from the substrate transfer space 2Sa to the external space of the housing 2.

With the above configuration, the EFEM 1 according to the present embodiment can circulate the nitrogen gas in the circulation path 21 and can execute a process of appropriately supplying and discharging the nitrogen gas to and from the circulation path 21 to adjust the oxygen concentration in the internal space of the housing 2 (also referred to as an in-housing purge process or an EFEM purge process).

Further, in the EFEM 1 according to the present embodiment, as shown in FIG. 1, a substrate transfer robot R is arranged in the substrate transfer space 2Sa.

The substrate transfer robot R includes a base portion R1 fixed in the substrate transfer space 2Sa, and an arm R2 whose base end portion is rotatably supported by the base portion R1. The substrate transfer robot R is an articulated robot in which a plurality of arm elements R3, R4 and R5 and a hand R6 constituting the arm R2 are sequentially rotatably connected to each other. The arm R2 of the present embodiment includes three arm elements R3, R4 and R5 and two (two-stage) hands R6. By rotating the arm elements R3, R4 and R5, it is possible to horizontally move the hand R6 that holds the substrate W. The number of arm elements and hands is not limited thereto. The arm elements R3, R4 and R5 are arranged from below in this order. Specifically, the base end portion of the lowermost arm element R3 is rotatably connected to the base portion R1, the base end portion of the middle arm element R4 is rotatably connected to the distal end portion of the lowermost arm element R3, the base end portion of the uppermost arm element R5 is rotatably connected to the distal end portion of the middle arm element R4, and the robot hand R6 is rotatably connected to the distal end portion of the uppermost arm element R5.

The internal spaces of the arm elements R3, R4 and R5 communicate with each other via a predetermined gap. The substrate W can be held in the robot hand R6 by operating a mechanical component such as a cylinder or the like built in the robot hand R6.

Further, the substrate transfer robot R of the present embodiment is configured to adjust or change the height position of the arm R2 by connecting the base end portion of the arm R2 to an elevating column R8 and moving the elevating column R8 up and down with respect to the base portion R1. In the internal space R1a of the base portion R1, there is arranged a drive mechanism R9 such as a motor or the like for driving the elevating column R8 up and down and for rotationally driving the arm R1. The drive mechanism R9 may be installed in each arm. An opening that allows the elevating column R8 to move up and down is formed on the upward surface of the base portion R1, and the lower end portion of the elevating column R8 is connected to the drive mechanism R9 in the internal space R1a of the base portion R1.

Further, a feeding port R11 for feeding a nitrogen gas to the circulation path 21 is formed at a predetermined position in the base portion R1 of the transfer robot R, and the feeding port R11 is connected to the return path 22 by a connecting pipe R12. In the present embodiment, the connecting pipe R12 is connected to the return path 22 on the upstream side of a filter 22g as a capture part in the gas flow direction. FIG. 1 shows a configuration in which the connecting pipe R12 is connected to a duct 22f.

A fan R13 rotationally driven at a constant rotational speed is provided in the vicinity of the feeding port R11. When the fan R13 is driven, the gas in the internal space of the transfer robot R (the internal space R1a of the base portion R1 and the internal spaces of the arm elements R3, R4 and R5) is discharged to the connecting pipe R12 to flow toward the return path 22. Therefore, even if particles are generated in the internal space of the transfer robot R (the internal space R1a of the base portion R1 and the internal spaces of the arm elements R3, R4 and R5), it is possible to suppress the particles from leaking into the substrate transfer space 2Sa. Further, the particles discharged to the return path 22 are removed by the filter 22g arranged on the upstream side of the return path 22 and are also removed by the FFU 23 and the chemical filter 24 arranged on the downstream side of the return path 22. Therefore, it is possible to suppress the substrate transfer space 2Sa from being contaminated by the particles generated in the internal space of the substrate transfer robot R (the internal space R1a of the base portion R1 and the internal spaces of the arm elements R3, R4 and R5).

As shown in FIG. 1, in the EFEM 1 of the present embodiment, an aligner 7 for detecting an amount of deviation of a holding position of the substrate W held by the arm R2 of the transfer robot R from a target holding position and performing position correction (alignment) to correct the positional deviation is installed in the substrate transfer space 2Sa. The aligner 7 includes an alignment table 71 on which the substrate W to be aligned is mounted, an alignment case 72 in which a drive mechanism 73 for rotationally driving the alignment table 71 is built, and a rotary column 74 having a lower end portion connected to the drive mechanism 73 in the alignment table 71. The alignment table 71 is fixed to the upper end of the rotary column 74. The alignment case 72 is supported by a support base (not shown) fixed in the substrate transfer space 2Sa. A through-hole 75 formed on the side wall of the alignment case 72 is connected to the return path 22 via a connecting pipe 76. In the present embodiment, the connecting pipe 76 is connected to the return path 22 on the upstream side of the filter 22g as the capture part in the gas flow direction. FIG. 1 shows a configuration in which the connecting pipe 76 is connected to the duct 22f. Further, in the present embodiment, a fan 77 is provided near the through-hole 75 of the alignment case 72. When the fan 77 is rotationally driven, the gas in the alignment case 72 is discharged toward the connecting pipe 76 together with the particles generated in the alignment case 72. In the present embodiment, the aligner 7 is arranged in a space overhanging to one side of the substrate transfer space 2Sa.

Next, the operation flow of the EFEM 1 will be described.

First, the FOUP 4 is transferred to above the load port 3 by a container transfer device such as an OHT or the like and is mounted on the mounting table 35. At this time, for example, the positioning protrusion provided on the mounting table 35 fits into the positioning recess of the FOUP 4, and the lock claw on the mounting table 35 is locked (locking process). In the present embodiment, the FOUP 4 can be mounted on the mounting table 35 of each of three load ports 3 arranged side by side in the width direction of the housing 2. Further, a seating sensor (not shown) that detects whether or not the FOUP 4 is mounted at a predetermined position on the mounting table 35 may be used to detect that the FOUP 4 is mounted at a normal position on the mounting table 35.

In the load port 3 of the present embodiment, when the FOUP 4 is mounted at the normal position on the mounting table 35, it is detected that the bottom surface portion of the FOUP 4 presses, for example, the pressed portion of a pressure sensor provided on the mounting table 35. With this as a trigger, a process (bottom purge process) of supplying a nitrogen gas to the internal space 4S of the FOUP 4 by a bottom purge device (not shown) to replace the internal space 4S of the FOUP 4 with the nitrogen gas is performed to reduce each of the water concentration and the oxygen concentration in the FOUP 4 to a predetermined value or less, thereby converting the surrounding environment of the substrate W in the FOUP 4 into a low humidity environment and a low oxygen environment.

After the locking process, the load port 3 of the present embodiment executes a process (door opening process) of moving the mounting table 35 located at the position shown in FIG. 1 to a predetermined docking position, moving the FOUP door 43 together with the load port door 33, and opening the opening 31 of the frame 32 and the loading/unloading port 41 of the FOUP 4 to release the sealed state of the FOUP 4.

By executing the door opening process, the internal space 4S of the FOUP main body 42 and the substrate transfer space 2Sa of the housing 2 are in communication with each other. The substrate transfer robot R provided in the substrate transfer space 2Sa of the housing 2 executes a process (transfer process) of taking out the substrate W from the slot of the FOUP main body 42 or storing the substrate W in a specific slot.

The load port 3 of the present embodiment executes a process (door closing process) of, when a processing process by the processing apparatus M has been completed for all the substrates W in the FOUP 4, moving the load port door 33 to a fully closed position by the door opening/closing mechanism 34 and closing the opening 31 of the frame 32 and the loading/unloading port 41 of the FOUP 4 to seal the internal space 4S of the FOUP 4. By the above-described processes, the opening 31 of the frame 32 and the loading/unloading port 41 of the FOUP 4 are closed by the load port door 33 and the FOUP door 43, respectively, and the internal space 4S of the FOUP 4 is sealed.

Subsequently, the load port 3 of the present embodiment moves the mounting table 35 away from the frame 32 to release the locked state of the FOUP 4. As a result, the FOUP 4 storing the substrates W subjected to a predetermined process is handed over to the container transfer device from the mounting table 35 of each load port 3 and is carried out to the next process.

As described above, the EFEM 1 according to the present embodiment executing these processes includes the circulation path 21 including the substrate transfer space 2Sa formed inside the housing 2 and the return path 22 for causing the gas flowing from one side (upper side) of the substrate transfer space 2Sa to the other side (lower side) thereof to return toward one side (upper side) of the substrate transfer space 2Sa. The EFEM 1 according to the present embodiment includes the partition wall 22c that separates the substrate transfer space 2Sa and the return path 22, the filter 22g as a capture part provided in the return path 22 having a pressure higher than that of the substrate transfer space 2Sa while the gas is circulating in the circulation path 21 and configured to capture the particles contained in the gas flowing through the return path 22, and the connecting pipes R12 and 76 that guide the gas flowing inside the devices (the substrate transfer robot R and the aligner 7) arranged in the substrate transfer space 2Sa to the return path 22. The connecting pipes R12 and 76 are connected to the return path 22 on the upstream side of the filter 22g in the gas flow direction. According to the EFEM 1 of the present embodiment having such a configuration, the particles contained in the gas (for the main example, the nitrogen gas) flowing through the return path 22 can be captured by the filter 22g. Therefore, in the EFEM 1 according to the present embodiment, the gas flowing inside the predetermined device (the substrate transfer robot R and the aligner 7) arranged in the substrate transfer space 2Sa is introduced into the return path 22 through the connecting pipes R12 and 76, whereby the particles contained in the gas (the particles generated and swirling upward from the location where the drive mechanism parts provided inside the substrate transfer robot R and the aligner 7 are arranged) can be captured by the filter 22g. It is possible to prevent or suppress the occurrence of a situation in which the particles collected in the return path 22 are discharged into the substrate transfer space 2Sa and adhere to the substrate W. Moreover, in the EFEM 1 of the present embodiment, the gas flowing inside the substrate transfer robot R and the aligner 7 is introduced into the return path 22 at a position upstream of the filter 22g, so that the particles contained in the mixed gas including the gas flowing through the substrate transfer space 2Sa and the gas flowing inside the substrate transfer robot R and the aligner 7 can be efficiently captured by the filter 22g.

With the above configuration, in the EFEM 1 according to the present embodiment, even if the gas leaks from the return path 22 having a relatively high pressure toward the substrate transfer space 2Sa having a relatively low pressure, the number of particles in the substrate transfer space 2Sa is unlikely to increase. This makes it possible to prevent or suppress the adhesion of particles to the substrate W in the substrate transfer space 2Sa.

In particular, according to the EFEM 1 of the present embodiment, the gas containing the particles generated inside the substrate transfer robot R and the aligner 7 is sucked into the return path 22 through the connecting pipes R12 and 76, so that the particles can be efficiently captured with the filter of 22g.

Further, in the EFEM 1 according to the present embodiment, the capture parts (chemical filters) R14 and 78 are provided in the connecting pipes R12 and 76 for introducing the gas flowing inside the predetermined devices (the substrate transfer robot R and the aligner 7) arranged in the substrate transfer space 2Sa into the return path 22, respectively. As a result, the particles contained in the gas sent to the connecting pipes R12 and 76 by the fans R13 and 77 near the upstream end of the connecting pipes R12 and 76 can be efficiently captured by the capture parts R14 and 78. This makes it possible to reduce the number of particles introduced into the return path 22 from the inside of the predetermined devices (the substrate transfer robot R and the aligner 7) arranged in the substrate transfer space 2Sa.

In addition, according to the EFEM 1 of the present embodiment, the fan 22b that sucks the gas flowing in the return path 22 to form an air flow toward one side (upper side) of the substrate transfer space 2Sa is provided at or near the upstream end of the return path 22, whereby the gas can be efficiently sent from the return path 22 toward one side of the substrate transfer space 2Sa. Further, the filter 22g is provided on the downstream side of the fan 22b in the gas flow direction, whereby the particles generated inside the substrate transfer space 2Sa, the substrate transfer robot R and the aligner 7 can be more efficiently captured by the filter 22g.

Although the embodiment of the present disclosure has been described above, the present disclosure is not limited to the configuration of the above-described embodiment. For example, in the above-described embodiment, the nitrogen gas is taken as an example of the inert gas to be circulated in the circulation path. However, the present disclosure is not limited thereto. A desired gas such as a dry gas or an argon gas may be used.

In the above-described embodiment, there is exemplified the configuration in which three load ports are connected to the front wall of the transfer chamber. However, it may be possible to adopt a configuration in which less than three or four or more load ports are connected to the front wall of the transfer chamber.

The substrate is not limited to the semiconductor wafer but may be a glass substrate or the like.

In the above-described embodiment, there is exemplified the configuration in which the return path is formed by the partition wall constituting the column. Alternatively, the return path may be formed by the partition wall constituting the part other than the column or may be formed by a dedicated partition wall (a dedicated partition wall for forming the return path).

Further, the upstream end of the return path in the gas flow direction may be configured to communicate with the substrate transfer space via an opening or a hole formed in the partition wall. The return path may not be provided with the "downward opening 22e having a shape in which the cross-sectional area of the opening gradually increases toward the opening end" or the "duct 22f" exemplified in the above-described embodiment.

The present disclosure also includes a configuration in which the predetermined device arranged in the substrate transfer space is only the substrate transfer robot. Further, even if the predetermined device arranged in the substrate transfer space is a device other than the substrate transfer robot and the aligner, the present disclosure includes a configuration in which the connecting pipe that guides the gas flowing inside the predetermined device to the return path is connected to the return path on the upstream side of the capture part in the gas flow direction.

Further, when the circulation path is provided with a plurality of return paths (a plurality of columns in the above-described embodiment), a dedicated return path may be individually set for each predetermined device arranged in the substrate transfer space. For example, only to the connecting pipe communicating with the inside of the substrate transfer robot may be connected to a return path dedicated to the substrate transfer robot, and only the connecting pipe communicating with the inside of the aligner may be connected to a return path dedicated to the aligner.

In addition, the specific configuration of each part is not limited to the above-described embodiment, and various modifications may be made without departing from the spirit of the present disclosure.

According to the present disclosure, the connecting pipe that guides the gas flowing inside the predetermined device arranged in the substrate transfer space to the return path is connected to the return path, which has a higher pressure than the substrate transfer space when the gas circulates through the circulation path, on the upstream side of the capture part in the gas flow direction. Therefore, the particles generated inside the predetermined device arranged in the substrate transfer space can be efficiently captured by the capture part. Even when the gas containing particles flowing from the inside of the predetermined device arranged in the substrate transfer space to the return path leaks from the return path to the substrate transfer space, the number of particles in the substrate transfer space is unlikely to increase. This makes it possible to provide the EFEM capable of maintaining the cleanliness of the substrate transfer space at a predetermined reference value or higher.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An EFEM provided with a circulation path including a substrate transfer space formed inside a housing and a return path configured to return gas flowing from one side to the other side of the substrate transfer space, the EFEM comprising:

a partition wall configured to separate the substrate transfer space and the return path;

a physical filter provided in the return path having a higher pressure than the substrate transfer space in a state in which the gas circulates through the circulation path, and configured to capture particles contained in the gas flowing through the return path; and a connecting pipe configured to guide the gas flowing inside a predetermined device arranged in the substrate transfer space to the return path, wherein the connecting pipe is connected to the return path on an upstream side of the physical filter in a gas flow direction.

2. The EFEM of claim 1, wherein the predetermined device is a substrate transfer robot, and the gas inside the substrate transfer robot is sucked into the return path through the connecting pipe.

3. The EFEM of claim 2, wherein the predetermined device is an aligner, and the gas inside the aligner is sucked into the return path through the connecting pipe.

4. The EFEM of claim 3, wherein a fan configured to suck the gas in the substrate transfer space and send the gas into the return path is provided at or near an upstream end of the return path, and the physical filter is provided on a downstream side of the fan in the gas flow direction.

5. The EFEM of claim 2, wherein a fan configured to suck the gas in the substrate transfer space and send the gas into the return path is provided at or near an upstream end of the return path, and the physical filter is provided on a downstream side of the fan in the gas flow direction.

6. The EFEM of claim 1, wherein the predetermined device is an aligner, and the gas inside the aligner is sucked into the return path through the connecting pipe.

7. The EFEM of claim 6, wherein a fan configured to suck the gas in the substrate transfer space and send the gas into the return path is provided at or near an upstream end of the return path, and the physical filter is provided on a downstream side of the fan in the gas flow direction.

8. The EFEM of claim 1, wherein a fan configured to suck the gas in the substrate transfer space and send the gas into the return path is provided at or near an upstream end of the return path, and the physical filter is provided on a downstream side of the fan in the gas flow direction.

* * * * *